United States Patent [19]

Lang et al.

[11] Patent Number: 5,671,741
[45] Date of Patent: Sep. 30, 1997

[54] MAGNETIC RESONANCE IMAGING TECHNIQUE FOR TISSUE CHARACTERIZATION

[75] Inventors: Philipp Lang, San Francisco; Michael Wendland, Benicia; Maythem Saeed, Novato; Alexander Gindele, San Francisco, all of Calif.

[73] Assignee: The Regents of the University of California, Oakland, Calif.

[21] Appl. No.: 511,286

[22] Filed: Aug. 4, 1995

[51] Int. Cl.[6] ................................................. A61B 5/05
[52] U.S. Cl. ........................ 128/653.2; 324/307; 324/309
[58] Field of Search ........................ 128/653.2; 324/307, 324/309

[56] References Cited

U.S. PATENT DOCUMENTS

| | | | |
|---|---|---|---|
| 4,780,674 | 10/1988 | Breton et al. | 324/309 |
| 4,945,478 | 7/1990 | Merickel et al. | 364/413.22 |
| 5,407,659 | 4/1995 | Deutsch et al. | 424/9 |

FOREIGN PATENT DOCUMENTS

WO95/04940  2/1995  European Pat. Off. ......... G01R 33/56

OTHER PUBLICATIONS

Le Bihan, D., "Molecular Diffusion Nuclear Magnetic Resonance Imaging," *Magn. Reson. Quarterly* 7:1–30 (1991).

Stejskal and Tanner, "Spin Diffusion Measurements: Spin Echoes in the Presence of a Time–Dependent Field Gradient," *Chem. Phys.* 42:288–92 (1965).

Le Bihan et al., "MR Imaging of Intravoxel Incoherent Motions: Application to Diffusion and Perfusion in Neurologic Disorders," *Radiology* 161:401–07 (1986).

Moseley et al., "Early Detection of Regional Cerebral Ischemia in Cats: Comparison of Diffusion— and T2–Weighted MRI and Spectroscopy," *Magn. Reson. Med.* 14:330–46 (1990).

Warach et al., "Fast Magnetic Resonance Diffusion–Weighted Imaging of Acute Human Stroke," *Neurology* 42:1717–23 (1992).

Sundaram et al., "Magnetic Resonance Imaging of Osteosarcoma," *Skeletal Radiol.* 16:23–9 (1987).

Watanabe et al., "Magnetic Resonance Imaging and Histopathology of Cerebral Gliomas," *Neuroradiol.* 34:463–69 (1992).

Sundaram and MacLeod, "MR Imaging of Tumor and Tumorlike Lesions of Bone and Soft Tissue," *Am. J. Roentgen* 155:817–24 (1990).

Fletcher et al, "Pediatric Musculoskeletal Tumors: Use of Dynamic, Contrast–enhanced MR Imaging to Monitor Response to Chemotherapy," *Radiol.* 184:243–8 (1992).

Tien et al., "MR Imaging of High–Grade Cerebral Gliomas: Value of Diffusion–Weighted Echoplanar Pulse Sequences," *Am. J. Roentgen* 162:671–77 (1994).

Moseley et al., "Diffusion–Weighted MR Imaging of Acute Stroke: Correlation with T2–Weighted and Magnetic Susceptibility–Enhanced MR Imaging in Cats," *AJNR* 11:423–429 (1990).

Moseley et al., "Diffusion/Perfusion Magnetic Resonance Imaging," *Neuroimaging Clinics of North America*, vol. 2, No. 4, 693–718, (1992).

(List continued on next page.)

*Primary Examiner*—Marvin M. Lateef
*Assistant Examiner*—Eleni Mantis Mercader
*Attorney, Agent, or Firm*—Medlen & Carroll

[57] ABSTRACT

An in vivo diagnostic method for differentiating normal from diseased tissue is described, using diffusion-weighted magnetic resonance imaging (MRI). Differences in molecular diffusion between viable and necrotic tissue, and normal and diseased tissue, are measured using diffusion-weighted MRI techniques to evaluate the success of a medical treatment regimen.

25 Claims, 2 Drawing Sheets

OTHER PUBLICATIONS

Lang, et al., "Osteogenic Sarcoma in Nude Athymic Rats: Detection of Tumor Necrosis Using Diffusion–Weighted MR Imaging," *Society of Magnetic Resonance, Abstracts*, Nice, France, Aug. 19–25 (1995).

Lang et al., "Diffusion–Weighted MR Imaging Helps Differentiate Viable from Necrotic Tumor in Rat Osteogenic Sarcoma," *Society for Pediatric Radiology, Meeting Program*, Abstract #28, p. 48, Washington, D.C., Apr. 27–30 (1995).

MacFall and Le Bihan, "Comparison of Stimulated Echo, Spin Echo, and Steady–State Free Procession Pulse Sequences for MR Imaging Apparent Diffusion Coefficient Measurements," *Radiology* 169(P):344 (1988).

Karczmar et al., "Detection of Motion using B1 Gradients," *Magn. Resonn. Med.* 7:111–116 (1988).

Howseman, et al., "Improvements in Snap–Shot Nuclear Magnetic Resonance Imaging," *Br J Radiol* 61:822–828 (1988).

Partridge et al., "Morphological and Biochemical Characterization of Four Clonal Osteogenic Sarcoma Cell Lines of Rat Origin," *Cancer Research* 43:4308–14 (1983).

Underwood et al., "Structural and Functional Correlations in Parathyroid Hormone Responsive Transplantable Osteogenic Sarcomas," *Europ. J. Cancer* 15:1151–58 (1979).

Witzel et al., "An Experimental Osteosarcoma of the Athymic Nude Rat," *Invasion Metastasis* 11:110–15 (1991).

Wingen et al.; "Intraosseously Transplantable Osteosarcoma With Regularly Disseminating Pulmonary Metastases in Rats," *Cancer Letters* 23:201–11 (1984).

Hayes et al, "An Efficient, Highly Homogenous Radiofrequency Coil for Whole–Body NMR Imaging at 1.5 T," *J. Magn. Res.* 63:622–28 (1985).

Moseley, *Imaging Techniques: From Spin–Echo to Diffusion*, in Higgins, et al., eds., *Magnetic Resonance Imaging of the Body*, pp. 157–174 (Raven Press 1992).

Fletcher et al., "Pediatric Musculoskeletal Tumors: Use of Dynamic, Contrast–Enhanced MR Imaging to Monitor Response to Chemotherapy," *Radiology* 184:243–8 (1992).

Erlemann et al., "Response of Osteosarcoma and Ewing Sarcoma to Preoperative Chemotherapy: Assessment with Dynamic and Static MR Imaging and Skeletal Scintigraphy," *Radiology* 171:791–96 (1990).

Erlemann et al., "Time–Dependent Changes in Signal Intensity in Neoplastic and Inflammatory Lesions of the Musculoskeletal System After I.V. Administration of GD–DTPA," *Radiologe* 28:269–76 (1988).

Els T., Eis M., et al., Diffusion–weighted MR imaging of experimental brain tumors in rats, *Magma* 3(1):13–20 (1995) . . . .

Sevick et al., "Cytotoxic Brain Edema: Assessment with Diffusion–Weighted MR Imaging," *Radiology* 185:687–690 (1992).

Merboldt et al., "Diffusion Imaging Using Stimulated Echoes," *Magn. Res. Med.* 19:233–39 (1991).

Helmer et al., "Time Dependent Diffusion in RIF–1 Tumors: In vivo Extraction of Geometrical Parameters and Identification of Necrosis," *Proceedings of the Society of Magnetic Resonance*, vol. 2, p. 1044 (San Francisco, CA, Aug. 6–12, 1994).

Schiffenbauer et al., "Cyclocretine Accumulation Leads to Cellular Swelling in C6 Glioma Multicellular Spheroids: Diffusion and One–Dimensional Chemical Shift Nuclear Magnetic Resonance Microscopy," *Cancer Res.* 55(1):153–8 (1995).

Eis et al., "Quantitative Diffusion MR Imaging of Cerebral Tumor and Edema," *Acta Neurochir Suppl.* 60:344–46 (1994).

Dardzinski et al., "Rapid Tissue Oxygen Tension Mapping Using F Inversion–Recovery Echo–Planar Imaging of Perfluoro–15–Crown–5–Ether," *Magn. Reson. Med.* 32(1):88–97 (Jul. 1994).

Steen, R.G., "Edema and Tumor Perfusion: Characterization by Quantitative 1H MR Imaging," *Am. J. Roentgenol.* 158(2):259–64 (1992).

Tsuruda et al., "Diffusion–Weighted MR Imaging of Extraaxial Tumors," *Magn. Reson. Med.* 19(2):233–9 (1991).

MAGNETIC RESONANCE IMAGING TECHNIQUE FOR TISSUE CHARACTERIZATION

FIELD OF THE INVENTION

This invention relates to the field of medical diagnostic imaging, and more particularly, to the field of diffusion-weighted magnetic resonance imaging for investigating tissue morphology.

BACKGROUND OF THE INVENTION

It is essential for a physician following cancer patients during antitumor treatment, e.g. chemotherapy, radiation therapy, etc., to monitor the patient's response and determine whether the chosen treatment regimen is working. A prompt determination as to the efficacy of the therapy is critical, so that the treatment approach or drug regimen can be changed, if necessary, in order to extend the patient's life span. However, conventional diagnostic methods used to monitor a patient's response to treatment are often insufficient.

The oldest and most invasive method of monitoring a tumor is surgical biopsy. This modality of treatment evaluation provides a physical sample of tumor and non-tumor tissue that can be subsequently subjected to a battery of biochemical and histological assays. However, this technique of course necessitates a traumatic, invasive procedure, and can lead to complications such as bacterial infection or hemorrhage as a result of the surgical biopsy.

Imaging with X-ray radiation has been used as an alternative, non-invasive technique. Images produced by exposure of film to X-ray radiation reflect the relative density of the body tissues. Thus, bones image well using X-rays since they are significantly more dense than the surrounding soft-tissue. However, most neoplasms fail to image well under X-rays since they may have a similar density to the surrounding soft-tissues of the body. This similarity in density makes a determination of changes in the morphology of the tumor mass difficult, complicating the evaluation of a particular treatment regimen.

The more advanced X-ray computed tomography ("CT") imaging increases the level of detail by taking a series of axial sections of the subject, which may then be reconstructed using computer software to render a three-dimensional model of the interior of the patient. A CT scan can help detect the location of the tumor mass within the patient. However, this technique suffers from the same limitations as conventional X-rays in that it relies on differences in tissue density to produce a discernable image. Since the density of a neoplasm will often be similar to the surrounding normal tissues, defining the borders of the mass and differentiating viable from necrotic tumor tissue is difficult. Moreover, there are adverse health consequences for the patient who receives repeated exposure to X-ray radiation during multiple monitoring sessions.

What is needed is a non-invasive imaging technique that will provide the proper level of contrast resolution necessary to monitor a cancer patient's response to antitumor treatment, so that treatment-induced tumor necrosis can be adequately measured and quantified. The technique should provide sufficient specificity in differentiating tissue types without significant overlap.

SUMMARY OF THE INVENTION

This invention relates to the field of medical diagnostic imaging, and more particularly, to the field of diffusion-weighted magnetic resonance imaging (MRI) for investigating tissue morphology. Differences in molecular diffusion between normal and diseased tissue, and viable and necrotic tissue, can be measured and quantitated using the methods of the present invention to provide diagnostic information, for use in evaluating clinical treatment and therapies.

In one embodiment, a diagnostic method for the in vivo differentiation of viable and necrotic tissue is described, comprising: a) providing a patient having a region of diseased tissue; b) placing said region within a constant external magnetic field; c) applying at least one diffusion-weighted magnetic resonance imaging technique to said region; and d) differentiating viable from necrotic tissue based on the magnetic resonance signals produced by said imaging techniques. In a further embodiment, the magnetic resonance (MR) signals are used to calculate diffusion coefficients for said region, and said diffusion coefficients are used to differentiate necrotic from viable tissue in said region.

In an alternative embodiment, the present invention contemplates a clinical method for evaluating the success of a medical treatment, comprising: a) providing a patient undergoing medical treatment having a region of diseased tissue; b) placing said region within a constant external magnetic field; c) applying at least one diffusion-weighted magnetic resonance imaging technique to said region; and d) differentiating normal from diseased tissue based on magnetic resonance signals produced by said imaging technique, so as to evaluate the success of said medical treatment. In a further embodiment, the MR signals are used to calculate diffusion coefficients for said region, and said diffusion coefficients are used to differentiate normal from diseased tissue in said region. This clinical method can be used, for example, to differentiate between viable and necrotic tissue.

It is not intended, however, that the present invention be limited by the type of diseased tissue present in the patient. Diseased tissues suitable for differentiation by the methods of the present invention can include any metabolically or structurally abnormal tissue, such as ischemic or necrotic tissue present in patients with neoplastic, metabolic, hematologic, immunologic, vascular or endocrine diseases. Using the methods of the present invention the degree of tissue abnormality can be quantitated or graded. It is believed that the present invention can be used with success with a variety of neoplastic diseases, including (but not limited to) gastrointestinal cancer, pancreatic cancer, colon cancer, melanoma, lung cancer, and musculoskeletal neoplasms.

It is also not intended that the methods of the present invention be limited to use in any particular section of the body. Instead, it is contemplated that regions of diseased tissue located in the neck, the chest and cardiovascular system, the abdomen, pelvis and all internal organs, and the musculoskeletal system including the spine, the axial skeleton, the arms and the legs can all be imaged with sufficient tissue contrast using the methods of the present invention.

It is further contemplated that any number of MRI techniques may be incorporated into the methods of the present invention, including (but not limited to) diffusion-weighted spin-echo pulse sequences, diffusion-weighted gradient-echo pulse sequences, diffusion-weighted stimulated echo pulse sequences, diffusion-weighted echoplanar pulse sequences, and diffusion measurements with $B_1$ field gradients. Any diffusion-sensitive MRI technique which can be used to create diffusion-weighted images is appropriate for use in the present invention.

GENERAL DESCRIPTION OF THE INVENTION

Figure 1:
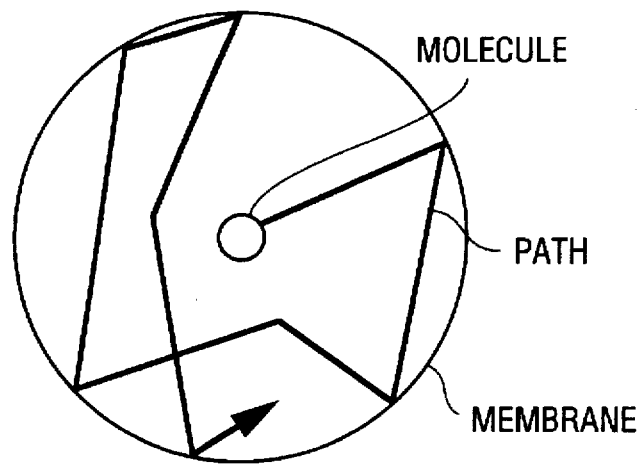
FIG. 1 is a diagram showing the diffusion path of a water molecule in a viable tissue cell.

This invention relates to the field of medical diagnostic imaging, and more particularly, to the field of diffusion-weighted magnetic resonance imaging for investigating tissue morphology. Magnetic resonance imaging constructs an image of body organs and tissue non-invasively by resolving structures from the signals produced by spin sensitive nuclei (such as protons) returning to equilibrium within a magnetic field. It can provide a cross-sectional display of the body organ anatomy with excellent contrast resolution of soft-tissue detail.

1. The Magnetic Resonance Phenomenon

The technique of magnetic resonance imaging encompasses the detection of certain atomic nuclei (those possessing magnetic dipole moments) utilizing magnetic fields and radio-frequency radiation. In an MRI experiment, the diamagnetic nuclei under study in a sample (e.g., protons, $^{19}F$, etc.) are placed in a controlled homogeneous magnetic field. These nuclei in the presence of the magnetic field populate two distinct energy levels. The separation between these two levels increases linearly with magnetic field strength, as does the population difference. The distribution between the two levels can be represented by the following formula:

$$Nl/Nu = exp(\Delta E/kT)$$

where Nl is number of nuclei in the lower level and Nu is the number of nuclei in the upper level, $\Delta E$ is the energy difference between the two levels ($\Delta E = h\omega$; $h = 6.62 \times 10^{-34} J \cdot S$) [Joules·second], k is the Boltzmann constant ($k = 1.3181 \cdot 10^{-23} J \cdot K^{-1}$), and T is the absolute temperature (Kelvin). Thus, if an external energy is applied in the amount $\Delta E$ it will cause the nuclei to jump to the high energy level.

In the presence of the external magnetic field, atomic nuclei possessing a magnetic dipole moment will precess around the external magnetic field. The frequency of this precessing motion is given by the Larmor equation:

$$\omega = \gamma \cdot B_0$$

where $\omega$ is the Larmor frequency, $\gamma$ is the gyromagnetic ratio and $B_0$ is the strength of the magnetic field. Nuclei with different gyromagnetic ratios will precess with different Lamor frequencies if placed in the same magnetic field. Consequently, their resonance frequencies will be different. In the case of protons, these nuclei precess at a frequency of 42.6 MHz at a field strength of 1 Tesla.

The sum of the nuclei precessing around the direction of the external field is equivalent to a single magnetic moment, called net magnetization. This represents the total magnetization of the population difference (those excess nuclei in the lower energy level at equilibrium). In order to detect this net magnetization it is necessary to tip it away from the axis of the main field. This is achieved with a radio frequency ("RF") pulse at the resonance frequency. Normally, radiowaves of high intensity are applied during a short period of time (pulsed magnetic resonance). Following the RF pulse, the net magnetization is tipped away from its axis, creating a vector (a component of magnetization) rotating at the Larmor frequency. This rotating magnetic vector causes a small current to flow in the detector coil, giving rise to the MRI signal.

The phase and frequency of the signal are a direct consequence of the local magnetic field experienced by the nuclei. By superimposing a magnetic field gradient on the external magnetic field, the frequency of the MRI signal will shift in accordance with its position along the gradient, and therefore its position in space is defined. Gradient magnetic fields are normally generated by passing an electric current through specially-wound electric coils that reside within the main magnetic field, which can produce linearly varying magnetic fields. These gradients are oriented in directions X, Y, and Z in order to define, at all times, the volume elements which resonate at known frequencies. In order to obtain a complete picture, the local conditions are superimposed in programmed sequences, which are stored in a master computer. These sequences define the application times of the gradients, the excitation times of the nuclei by the RF pulses and the reading or acquisition times of the image data.

The duration of the return to equilibrium of the overall magnetic moment of a considered region and the decrease of the signal are dependent on two important factors, namely the spin-lattice interaction, and the spin-spin interaction of the particles with the surrounding material. These two factors have lead to the definition of two relaxation times, called respectively $T_1$ and $T_2$. $T_1$ is the spin-lattice relaxation time or longitudinal relaxation time, that is, the time taken by the nuclei to return to equilibrium along the direction of the externally applied magnetic field $B_0$. $T_2$ is the spin-spin relaxation time associated with the dephasing of the initially coherent precession of individual proton spins. Standard relaxation times have been established for various fluids, organs and tissues in different species of mammals.

The intensity of the MRI signal from a considered region of a sample is dependent on $T_1$ and $T_2$, the proton density of the region and the time which has elapsed since RF excitation. For protons and other suitable nuclei, the relaxation times $T_1$ and $T_2$ are also influenced by the environment of the nuclei (e.g., viscosity, temperature, and the like). Importantly, molecular motions due to pulsatile flow and convective or diffusive processes also intervene to modify the intensity of the intercepted signal when the nuclei return to their equilibrium orientation.

2. The Effect of Molecular Diffusion

One type of molecular motion which can affect the MRI signal is molecular diffusion, which consists of the random movement of tissue water molecules as they collide with each other. Barriers such as the cells membranes can alter the random motion to a partly directed one, and thereby influence diffusion. The diffusion coefficient, D, is used to characterize this kind of molecular motion.

MR imaging is the only non-invasive technique available to measure diffusion and map the motion of the water protons. Diffusion-weighted MR imaging exploits the random motion of the molecules, which causes a phase dispersion of the spins with a resultant signal loss. Using MRI to assess diffusion is attractive because it allows accurate control of the diffusion direction and the time during which diffusion takes place. Also, the mean diffusion path length or displacement of the diffusing protons can be determined.

Numerous MR methods have been developed to measure diffusion-induced signal changes and to measure the diffusion coefficient of liquids. See, e.g., Breton et al., U.S. Pat. No. 4,780,674, herein incorporated by reference. These include the use of spin-echo or stimulated echo sequences, steady-state free precession sequences, and gradient-echo and echoplanar sequences. See Le Bihan, D., *Magn. Reson. Quarterly* 7:1–30 (1991). These techniques vary the timing and duration of the RF pulse sequences to create echos in the MRI signal.

The preferred technique employed in the method of the present invention is derived from the "pulsed magnetic field gradient" spin-echo technique, first described by Stejskal and Tanner in 1965. See Stejskal and Tanner, *Chem. Phys.* 42:288–92 (1965). The spin-echo pulse sequence applies a 90° RF pulse followed by a 180° RF pulse, thereby creating an echo in the MRI signal. The original Stejskal-Tanner technique then incorporates a pair of square gradient pulses of strength $G_i$ (expressed in Gauss/cm), thus making the measurement quantitative and more sensitive to diffusion.

The observed echo intensity loss SI resulting from diffusion-induced incoherent phase loss is expressed as follows:

$$SI \propto \exp[-\gamma^2 \delta^2 G_i^2 (\Delta - \delta/3) D]$$

where $\delta$ and $G_i$ are the duration and the amplitude of the diffusion-sensitizing gradient pulses, $\gamma$ is the gyromagnetic ratio, $\Delta$ is the time interval between the leading edges of the square diffusion-sensitizing gradient pulses, and D is the apparent diffusion coefficient of the protons contributing to the signal intensity SI. The term $\gamma^2 \delta^2 G_i^2 (\Delta - \delta/3)$ is defined as the b-factor. In order to determine the magnitude of the diffusion effect, the diffusion coefficient D is measured by plotting the natural log of the observed spin-echo signal against the b-factor, as the strength and duration of the diffusion-sensitizing gradient $G_i$ is increased.

Diffusion-weighted MRI has only recently been applied to imaging human subjects. This is mainly the result of the high technical requirements in generating such images. Specifically, magnets that are capable of acquiring such images must have very high gradient strengths and very rapid gradient rise times which have only recently become available on whole-body magnets. At present, diffusion-weighted MR imaging has been applied clinically for the evaluation of cerebral ischemia and stroke. See Le Bihan et al., *Radiology* 161:401–07 (1986); Moseley et al., *Magn. Reson. Med.* 14.:330–46 (1990); Warach et al., *Neurology* 42:1717–23 (1992).

3. MRI in Cancer Patients

MRI is the diagnostic method of choice for imaging soft-tissue masses, and has been used for the identification and preoperative staging of body, musculoskeletal and brain tumors. See Sundaram et al., *Skeletal Radiol.* 16:23–9 (1987); Watanabe et al., *Neuroradiol.* 34:463–69 (1992). However, conventional MR imaging techniques have failed to provide a satisfactory level of information, since the extent of tumor necrosis and the presence of viable tumor, the two critical elements in determining tumor response and prognosis, have been difficult to determine on a consistent basis. Sundaram and MacLeod, *Am. J. Roentgen* 155:817–24 (1990).

The use of MR contrast agents has been pursued as an alternative method for improving tissue contrast. See, e.g., Fletcher et al, *Radiol.* 184:243–8 (1992). However, satisfactory differentiation between viable and necrotic tissue is still hampered by the eventual diffusion of the contrast agent into necrotic tissue, which can result in loss of the MR image contrast between the tissue types. Moreover, the use of contrast agents increases the cost of the imaging procedure, and requires "postcontrast" MR sequences in addition to the unenhanced scans, with a resultant increase in imaging time and cost.

Figure 2:
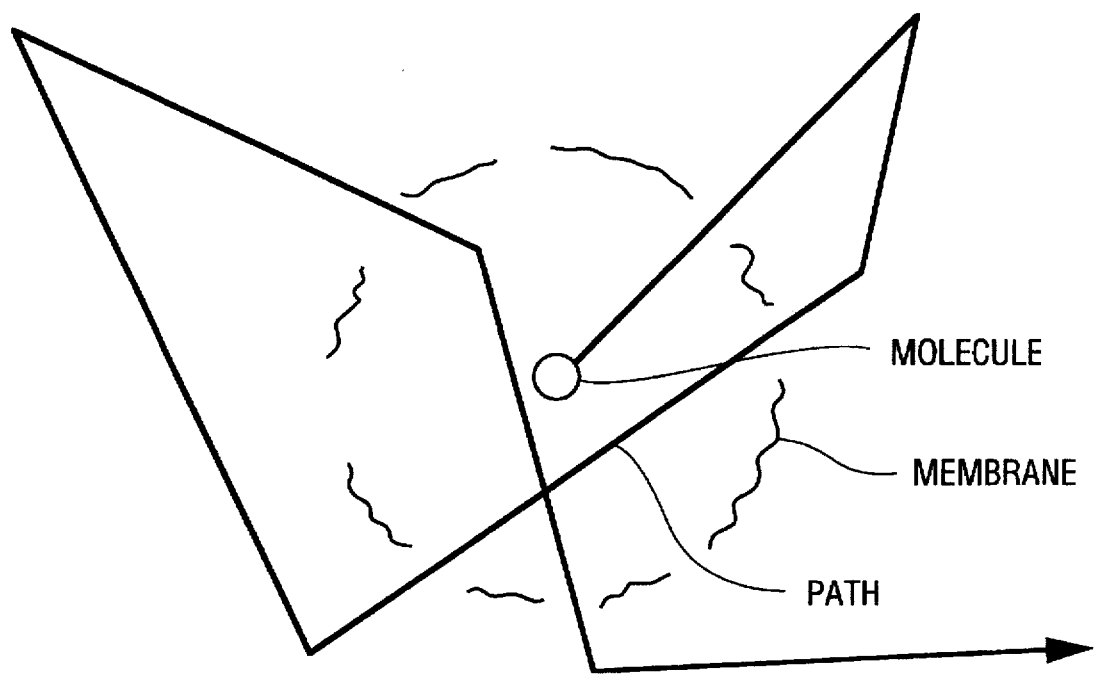
FIG. 2 is a diagram showing the diffusion path of a water molecule in a necrotic tissue cell.

The present invention capitalizes on the difference in molecular diffusion between normal and diseased tissues, such as viable and necrotic tumor or viable and necrotic inflammatory or infectious tissue. In viable tissue, the cell membrane and the intracellular membranes are intact, thereby restricting molecular diffusion. See FIG. 1. Molecules that are located inside viable cells and are detected as part of the MR signal are characterized by a relatively small mean free path length owing to the membrane structures. Necrotic tissue, in contrast, is characterized by a breakdown of the cell membrane and of the intracellular membranes resulting in free diffusion and in an increase in mean free path length of the resonating molecules. See FIG. 2. These differences in molecular diffusion between viable and necrotic tissue can be detected using an MR imaging technique that can measure diffusion-induced signal changes, i.e. diffusion-weighted MR imaging.

Moreover, the method of the present invention can also be used to detect differences in molecular diffusion between normal tissue and other types of diseased tissues. These diseased tissues include any metabolically or structurally abnormal tissue, such as ischemic or necrotic tissue present in patients with metabolic, hematologic, immunologic, vascular or endocrine disorders.

Diffusion-weighted MR imaging has previously been used in an attempt to differentiate various tumor components in cerebral gliomas. See Tien et al., *Am. J. Roentgen* 162:671–77 (1994). However, these studies lacked histologic correlation so that the true composition of the tissues exhibiting different MR signal intensities on conventional and diffusion-weighted MR imaging could not be elicited. Instead, diffusion-weighted MR images were correlated to conventional MR sequences which are known for their lack of tissue specificity. More importantly, as with the majority of the current applications of diffusion-weighted MRI, these studies were performed in the brain.

Normal brain tissue is characterized by markedly restricted diffusion due to the high structural organization of the tissue (see Moseley et al., *AJNR* 11:423–429 (1990); Moseley et al., *Neuroimaging Clinics of North America*, Vol. 2, No. 4, 693–718, (1992)), which can be expected to be similar to that of viable tumor. Thus, it is impossible in the brain to adequately differentiate normal brain tissue from viable tumor tissue, which is also characterized by restricted diffusion, using diffusion-weighted MRI. Differentiation between the various tissues is further hampered by the fact that normal grey matter and normal white matter demonstrate markedly different diffusion coefficients. Furthermore, brain tissue, and especially white matter, demonstrates marked anisotropy in molecular diffusion, i.e. differing diffusion coefficients along one or more axes of the magnet. This is because water molecules within the nerve fibers prefer to move along the fibers rather than across them. See Moseley et al., *AJNR* 11:423–429 (1990); Moseley et al., *Neuroimaging Clinics of North America*, Vol. 2, No. 4, 693–718, (1992).

Given these limitations, marked overlap in diffusion coefficients will be observed between the various tissues such as normal white matter, normal grey matter, peritumoral edema, viable tumor, and necrotic tumor. This critical overlap in tissue contrast resolution was observed by Tien et al., *Am. J. Roentgen* 162:671–77 (1994). Diffusion-weighted MR imaging therefore does not provide sufficient contrast resolution between different normal and neoplastic tissues in the brain and lacks the diagnostic specificity that is needed to employ it as a clinically useful diagnostic tool.

The situation is, however, totally different in imaging other regions of the body, specifically the neck, chest and cardiovascular system, the abdomen and pelvis including all internal organs, and the musculoskeletal system including the spine, the axial skeleton, the arms and legs. In these regions, normal tissues are not characterized by the high degree of internal structural organization that is present in the brain. Thus, normal tissues are characterized by relatively free diffusion resulting in good differentiation from viable tumor with its more restricted diffusion. See Lang, et al., *Society of Magnetic Resonance, Abstracts*, Nice, France, Aug. 19–25 (1995); Langet et al., *Society for Pediatric Radiology, Meeting Program*, Abstract#28, p. 48, Washington, D.C., Apr. 27–30 (1995). Problems from diffusional anisotropy of the tissue are not encountered to a significant degree, so that overall excellent tissue differentiation can be achieved. In imaging the body, diffusion-weighted MR imaging appears more specific than any other pre-existing technique for differentiating viable from necrotic tissue.

DETAILED DESCRIPTION OF THE PREFERRED EMBODIMENTS

1. The Diffusion-Weighted Spin-Echo Pulse Sequence

Figure 3:
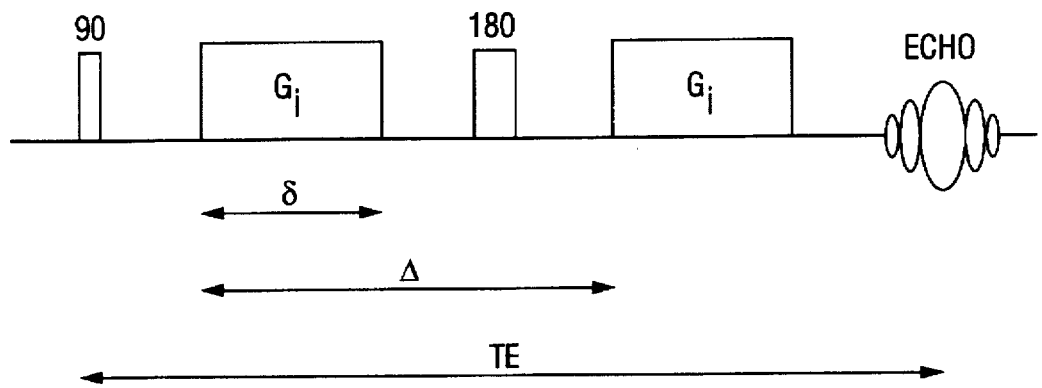
FIG. 3 is a diagram of the original Stejskal-Tanner diffusion-weighted magnetic resonance pulse sequence.
Figure 4:
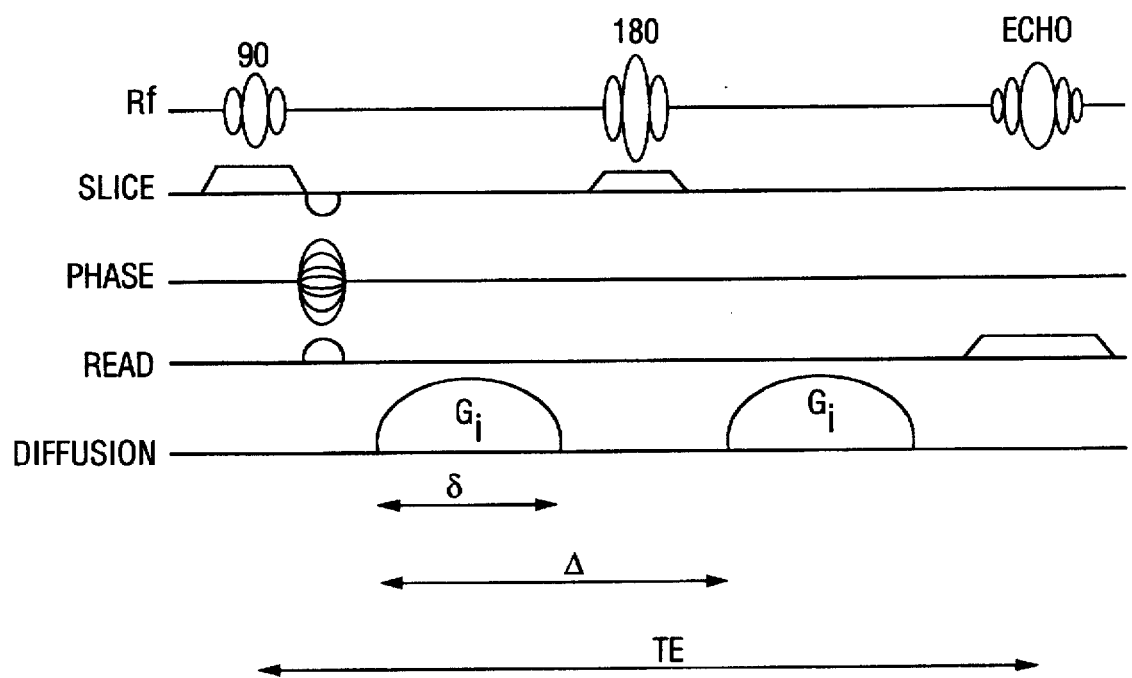
FIG. 4 is a diagram of a preferred diffusion-weighted spin-echo pulse sequence for use in the method of the present invention.

The original Stejskal-Tarmer sequence and the preferred diffusion-weighted spin-echo pulse sequence utilized in the present invention are shown in FIGS. 3 and 4, respectively. Because the two diffusion-sensitizing gradient pulses are symmetric (same length, amplitude, and position with respect to the RF pulses) and separated by a 180° RF pulse, all spin dephasing caused by the diffusion-sensitizing gradient pulse will be refocused by the second diffusion-sensitizing gradient pulse for stationary spins. Moving spins (because of flow, perfusion or diffusion) will not refocus and will attenuate the signal.

From the original Stejskal-Tarmer pulse sequence shown in FIG. 3, the observed echo intensity SI (TR, TE, $G_i$) can be expressed as follows:

$$SI(TR, TE, G_i) = SI(\infty, 0, 0) \exp(-TE/T_2)$$

$$X\{1-2 \exp[-(TR-TE/2)/T_1] + \exp[-TR/T_1]\}$$

$$X \exp[-\gamma^2\delta^2G_i^2(\Delta-\delta/3) D]$$

where $SI(\infty, 0, 0)$ is the signal at a repetition time (TR) of ∞ and an echo time (TE) of 0 msec; $T_1$ and $T_2$ are the longitudinal and transverse relaxation times, respectively; $\gamma$ is the gyromagnetic ratio; $\delta$ and $G_i$ are the duration and amplitude of the diffusion-sensitizing gradient pulses, respectively; $\Delta$ is the interval between the leading edges of the diffusion-sensitizing gradient pulses; and D is the water apparent self-diffusion coefficient. The first two terms of this equation represent $T_1$ and $T_2$ relaxation processes, with the third representing the diffusion-dependent term. Division of the two images obtained with use of the same MR imaging parameters with and without diffusion-sensitizing gradient pulses allows a determination of the apparent diffusion coefficient according to the following equation:

$$\ln SI(TE, G_i)/SI(TE, 0) = -\gamma^2\delta^2G_i^2(\Delta-\delta/3)D = -bD$$

where the gradient attenuation factor b is defined as $\gamma^2\delta^2G_i^2(\Delta-\delta/3)$.

This equation suggests a major advantage of using MR imaging methods for in vivo applications in that the direction of the diffusion-sensitizing gradient pulses can be controlled and apparent diffusion along the respective direction can be measured. By variation of the time separation ($\Delta$) between the diffusion-sensitizing gradient pulses, the mean free path length (the average distance one single molecule will diffuse in a designated interval of time) can be estimated with the Einstein equation:

$$l = \sqrt{4 \cdot Dt}$$

where 1 is the mean free path length, D is the measured diffusion coefficient and t is the time. As the strength and duration of the diffusion-sensitizing gradient pulses are increased, the apparent diffusion of the more freely diffusing protons is manifested as signal loss on the observed magnitude-calculated, diffusion-weighted image, leaving only the slower-diffusing proton motions to contribute to image intensities.

2 Alternative Diffusion-Weighted Pulse Sequences

Several other techniques may also be employed to generate diffusion-weighted MR images. These include the stimulated echo technique, gradient-echo technique, diffusion measurements with $B_1$ gradients, and echo planar imaging. See Le Bihan, *Magn. Reson. Quarterly* 7:1–30 (1991).

Stimulated Echo Technique

A stimulated echo can be produced from a sequence comprised of three RF pulses separated by time intervals $\tau 1$ and $\tau 2$. The remarkable feature of this sequence resides in the magnetization evolution during the period $\tau 2$ between the second and third RF pulse. After the second RF pulse, part of the transverse magnetization (exactly half in the case where a 90° pulse is used) is stored as longitudinal magnetization, which becomes insensitive to field inhomogeneities and $T_1$ decays. Because $T_1$ is usually much longer than $T_2$ in biological tissues, longer evolution times can be achieved than with a spin-echo sequence, without the usual signal penalty due to $T_2$-decay. The third RF pulse returns the stored magnetization to the transverse plane at time $\tau 1$ after the third pulse.

This property is particularly useful for diffusion measurement purposes, where long diffusion times are required. Gradient pulses must be inserted within the first and third periods of the stimulated echo sequence. The diffusion time then includes $\tau 2$ and can be much longer than with a spin-echo sequence. The longer diffusion time is useful to study very slow diffusion rates or to compensate for the unavailability of large gradients. There is unfortunately a signal reduction of one half, when compared with the spin-echo signal. Due to signal-to-noise considerations, it appears that this sequence is useful primarily in the presence of tissues with short $T_2$ or when the spin-echo sequence cannot be used. See McFall et al., *Radiology* 169:344 (1988).

Gradient-Echo Technique

The effect of diffusion on the amplitude of a gradient-echo formed by a bipolar gradient pulse pair of reversed polarity does not differ from that of a spin-echo sequence. Using a steady state free precession (SSFP) gradient-echo sequence, some degree of phase coherence is propagated throughout successive cycles, especially when low flip angles are used. Due to the multiple echo paths that are then formed, an SSFP train can be considered for diffusion as a mixture of different schemes (i.e. gradient-echo, spin-echo, stimulated echo, and higher order echoes) with different diffusion times and different diffusion weighing. The SSFP technique and other gradient-echo techniques may provide very rapid image acquisition for diffusion-weighted MR imaging thereby reducing motion artifact in the body. The effects of involuntary macroscopic motion are just as important as in spin-echo sequences although ghosting is significantly reduced because any motion-related phase shift will propagate through all acquisition cycles. Moreover, the effects of diffusion and relaxation are mingled and no longer nicely separated in a multiplicative manner as with spin-echoes, so that diffusion measurements are always contaminated at some degree by relaxation effects.

Diffusion Measurements with $B_1$ Field Gradients

Diffusion measurements can also be achieved by means of the RF ($B_1$) field produced by an NMR RF coil. Karczmar et al., *Magn. Reson. Med* 7:111–116 (1988). This approach has been suggested to overcome the hardware problems encountered when using strong static magnetic field ($B_0$) gradients. This approach relies on the use of a pair of symmetric RF ($B_1$) gradients. As in the case of the $B_0$ gradient pulse sequence, moving spins will become incompletely refocused by the sequence, which results here in a loss of longitudinal magnetization. This longitudinal magnetization loss can be probed using an observe pulse or an imaging sequence. This signal loss will be depend on the diffusion coefficient and relaxation ($T_1$). With RF gradients, extremely short switching times can be achieved, because there are no eddy currents. Furthermore, substantial gradient strength may be produced depending on the output of the RF transmitter. Unfortunately, such strong and long RF field pulses may result in high power deposition that may be incompatible with clinical use.

Echoplanar Imaging Technique

With echoplanar imaging (EPI), the entire set of echoes needed to form an image is collected within a single acquisition period (single shot) of 25–100 msec. This is obtained by switching the echo signal formation (which can be either an RF refocused spin-echo or a gradient-echo) in a train of gradient-echoes, by means of a large gradient in which polarity is rapidly inverted, as many times as is required to achieve the desired image resolution. EPI may easily be sensitized to diffusion. The favored EPI technique is the modulus blipped echoplanar single pulse technique (MBEST) sequences (Hauseman, et al., *Br J Radiol* 61:822–828 (1988)), either in its spin-echo or gradient-echo form. Sensitization consists of providing a pair of large compensated gradients for a period of time before rapid gradient switching and data acquisition.

With EPI, motion artifacts, e.g. artifacts induced by cardiac motion or respiration, are virtually eliminated due to the rapid image acquisition. However, signal-to-noise ratios are mediocre in single EPI images. At present, EPI is also limited by low spatial resolution which may be insufficient for delineating diseased tissue morphology adequately. EPI is also vulnerable to susceptibility artifacts which may result in image distortion or signal drop-out. Additionally, EPI is sensitive to chemical shift artifacts which may require the use of efficient fat suppression.

While a preferred embodiment has been described in some detail, it should be apparent from the above discussion that many modifications and variations of the sequences and gradient techniques described above are possible without deviating from the invention. It is also contemplated that any current or future magnetic resonance imaging technique that is sensitive to molecular diffusion and can be used to create diffusion-weighted MR images may be incorporated into the method of the present invention to distinguish diseased tissue from normal tissue. Furthermore, improvements and modifications which become apparent to persons of ordinary skill in the art only after reading this disclosure, the drawings and the appended claims are deemed within the spirit and scope of the present invention.

EXPERIMENTAL

The following examples serve to illustrate certain preferred embodiments and aspects of the present invention and are not to be construed as limiting the scope thereof.

In the experimental disclosure which follows, the following abbreviations apply: eq (equivalents); M (Molar); µM (micromolar); N (Normal); mol (moles); mmol (millimoles); µmol (micromoles); nmol (nanomoles); gm (grams); mg (milligrams); kg (kilograms); µg (micrograms); L (liters); ml (milliliters); µl (microliters); cm (centimeters); mm (millimeters); µm (micrometers); nm (nanometers); ° C. (degrees Centigrade); G (Gauss); sec (seconds); msec (milliseconds); J (Joules); K (Kelvin); and ATCC (American Type Culture Collection, Rockville, Md.).

EXAMPLE 1

Diffusion Imaging of Osteogenic Sarcoma in Nude Athymic Rats

The diagnostic method of the present invention was used to accurately differentiate necrotic from viable tumor tissue in nude athymic rats, using the osteogenic sarcoma cell line UMR 106 (ATCC CRL 1661). This rat osteogenic sarcoma cell line and the nude athymic rat animal model have been established as accurate models for osteosarcoma in humans. See, e.g., Partridge et al., *Cancer Research* 43:4308–14 (1983); Underwood et al., *Europ. J. Cancer* 5:1151–58 (1979); Witzel et al., *Invasion Metastasis* 11:110–15 (1991); Wingen et al.; *Cancer Letters* 23:201–11 (1984).

Samples of the rat osteogenic sarcoma cell line (UMR 106) were implanted subcutaneously into the left hind leg of 12 nude athymic rats (Harlan Sprague Dawley, Inc., San Diego, Calif.). Specifically, an approximately 2 mm large fragment of viable tumor was excised from a tumor-bearing rat, and implanted directly into the left hind leg after subcutaneous and fascial incision. The tumors were then allowed to grow for 10–12 days until a palpable mass was present.

Prior to magnetic resonance imaging each animal was anesthetized by intraperitoneal injection of sodium pentobarbital (50 mg/kg) (Anthony Products, Inc., Arcadia Calif.), and connected to a rodent ventilator (Model 683, Harvard Apparatus, South Natick, Mass.) following tracheotomy. Each animal was placed supine in a plastic holder, with the legs extended and lightly secured, and inserted into a home-built "birdcage" (described in Hayes et al., *J. Magn. Res.* 54:622–28 (1985)) imaging coil (5.6 cm inner diameter) such that the tumors were in the center of the coil. The preparation was then inserted into the magnet with the center of the imaging coil aligned with the center of the imaging gradients. A 5 mm NMR sample tube filled with Gd-DPTA-doped water (gadolinium-diethylene triamine penteacetic acid, a contrast agent, sold as Magnevist™, Berlex, Cedar Hills, N.J.) was placed alongside each animal to provide a water diffusivity reference. The Gd-DPTA was used at a concentration sufficient to give a $T_1$ relaxation time of the phantom of approximately 500 msec.

Magnetic resonance imaging was performed on a 2.0 Tesla small bore magnet (Bruker Omega 2.0T System, Bruker Instruments, Inc., Fremont, Calif.) equipped with actively shielded gradients (Accustar™ S-150, Bruker Instruments, Inc., Fremont, Calif.) capable of delivering field gradients up to 20 G/cm along each axis (X, Y and Z). The imaging sequences used were as follows: diffusion-weighted spin-echo (described above); $T_1$-weighted spin-echo (described in Moseley, *Imaging Techniques: From Spin-Echo to Diffusion*, in Higgins et al., eds., *Magnetic Resonance Imaging of the Body*, pp. 157–174 (Raven Press 1992) obtained before and after the administration of Gd-DTPA (Magnevist™, Berlex, Cedar Hills, N.J.) for comparison of diffusion images to contrast-enhanced images; $T_2$-weighted double-echo spin-echo to measure regional $T_2$ values (described in Moseley, *Imaging Techniques*, supra). The use of Gd-DTPA as a contrast agent in MR imaging is standard in the art and is described in Fletcher et al., *Radiology* 184:243–8 (1992), Erlemann et al., *Radiology* 171:791–96 (1990); and Erlemann et al., *Radiologe* 28:269–76 (1988).

All images were obtained as multislice acquisitions (contiguous slices=8) for complete coverage of the tumor and surrounding nontumorous tissues. In-plane dimensions of each image were 4.0×4.0 cm defined by a raw data matrix of 256×128 points interpolated to 256×256 pixels in reconstructed images. For diffusion-weighted images, TR and TE were set to 2500 and 80 msec, respectively; the duration of the diffusion-sensitizing gradient pulse (δ) was 20 msec; and the time between the diffusion gradient pulses (Δ) was 50.4 msec. The shape of the diffusion-sensitizing gradient was a half sine. In each experiment, two diffusion images were acquired in succession in which the amplitude of the diffusion gradient was set to 1 and 5 Gauss/cm, respectively. These settings resulted in gradient b factors of 52 and 1316 s/mm², respectively, for the two images, where:

$$b=[\gamma^2 G^2 \delta^2 (4\Delta-\delta)]/\pi^2$$

for half-sine shaped gradient pulses (obtained by derivation from the Stejskal-Tanner equations) and:

γ=the gyromagnetic ratio in units of radians/sec (2π*42.6 MHz/T)

G=strength of field gradient in units of Gauss/cm (or Gauss/mm)

δ=duration of each gradient lobe

Δ=time separation between gradient lobes.

Apparent diffusion coefficients (ADC) of different regions were calculated according to the equation:

$$SI(b)=SI(0)X \exp[-b(ADC)]$$

where SI(b) and SI(0) are regional signal intensities obtained with and without diffusion-sensitizing gradients. Values for ADC for tissue zones were normalized to that of the water phantom, i.e. normalized apparent diffusion coefficient (nADC).

The $T_1$-weighted images were obtained with TR and TE set to 400 and 12 msec, respectively, and repeated 15 min after intravenous application of 0.2 mmol/kg body weight gadolinium-DTPA (Magnevist™, Berlex, Cedar Hills, N.J.)). The relative increase in signal intensity $SI_{increase}$ on postcontrast imaging studies was calculated as $SI_{increase}=(SI_{post}-SI_{prior})/SI_{prior}$, where $SI_{post}$ was the signal intensity of the region of interest (ROI) on the postcontrast image and $SI_{prior}$ was the signal intensity of the ROI on the precontrast image.

$T_2$-weighted images were obtained with TR set to 2500 msec and TE set to 40 and 80 msec in a double echo acquisition. $T_2$-relaxation times were calculated for the different regions of interest using the equation:

$$SI(TE)=SI(0)\exp[-TE/T_2]$$

Thus all regions of interest in tumors were visually analyzed and were characterized quantitatively with regard to apparent diffusion coefficient, degree of contrast enhancement, and the magnitude of $T_2$ relaxation times.

After completion of imaging the animals were sacrificed and the tumor bearing leg was excised. Tumors were cut into 3 mm thick sections matching the image slices. Standard histology was obtained using hematoxyline-eosine staining. Slice-by-slice correlation was performed between imaging studies and histologic sections. Signal intensity of different tumor regions were graded high, intermediate or low for each of the MR sequences based on visual analysis. The histologic composition of the various high, intermediate and low signal intensity areas was determined. Signal intensities of regions containing a) viable tumor, b) tumor necrosis, c) necrosis with intermixed hemorrhage, and d) edematous connective tissue were measured on all sequences. Analysis of variance models was used to analyze the quantitative signal intensity data, nadc, $T_2$-relaxation times, and $SI_{increase}$ of reach ROI statistically.

TABLE 1

Apparent Diffusion Coefficients (ADC) And Relative Signal Intensity ($SI_{increase}$) Of Different Tissues In Osteogenic Sarcoma

| Tissue | ADC | | $SI_{increase}$ | |
|---|---|---|---|---|
| | m | SD | m | SD |
| Viable Tumor | 0.32 | 0.06 | 0.70 | 0.43 |
| Necrosis | 0.91 | 0.40 | 0.45 | 0.45 |
| Hemorrhagic Tumor Necrosis | 0.81 | 0.28 | 0.70 | 0.55 |
| Edematous Connective Tissue | 1.21 | 0.28 | 0.89 | 0.59 |

Viable tumor demonstrated high signal intensity on $T_2$-weighted images and on diffusion-weighted images. On postcontrast $T_1$-weighted images, viable tumor showed a marked increase in signal intensity. Necrotic tumor also showed high signal intensity on $T_2$-weighted images. On diffusion-weighted images, however, necrotic tumor was seen to show marked decrease in signal intensity. As shown in Table 1, the ADC of necrotic tumor and hemorrhagic tumor necrosis was significantly higher than that of viable tumor (p<0.0001: Table 1).

On postcontrast $T_1$-weighted imaging studies, viable minor demonstrated greater or equal signal intensity increase than necrotic tumor and hemorrhagic tumor necrosis. The difference, however, was not statistically significant due to the large standard deviations (difference $SI_{increase}$ viable tumor vs. necrotic tumor p<0.16, viable tumor vs. hemorrhagic tumor necrosis p<0.70, Table 1).

Edematous connective tissue demonstrated signal behavior similar to that of necrotic tumor and hemorrhagic tumor necrosis on diffusion-weighted images and also had similar ADC values (Table 1). However, edematous connective tissue was located at the tumor margin, while tumor necrosis was typically present in the central portions of the tumor. The tissues could therefore be differentiated using morphologic features.

We claim:

1. A diagnostic method for differentiating necrotic from viable tissue in vivo, comprising the steps of:

a. providing a patient having a region of diseased tissue;

b. placing said region within a constant external magnetic field;

c. applying at least one diffusion-weighted magnetic resonance imaging technique to said region; and d. differentiating necrotic from viable tissue based on magnetic resonance signals produced by said imaging technique.

2. The method of claim 1, wherein said magnetic resonance signals are used to calculate diffusion coefficients for said region, and said diffusion coefficients are used to differentiate necrotic from viable tissue in said region.

3. The method of claim 1, wherein said patient is a patient with a neoplastic disease and said diseased tissue is tumor tissue.

4. The method of claim 1, wherein said patient is a patient with an inflammatory disease, and said diseased tissue is inflamed tissue.

5. The method of claim 1, wherein said patient is a patient with an infectious disease, and said diseased tissue is infected tissue.

6. The method of claim 1, wherein said region of diseased tissue is selected from the group comprising: the neck, the chest and cardiovascular system, the abdomen, pelvis and all internal organs, and the musculoskeletal system including the spine, the axial skeleton, the arms and the legs.

7. The method of claim 1, wherein said diffusion-weighted magnetic resonance imaging technique comprises a diffusion-weighted spin-echo pulse sequence.

8. The method of claim 1, wherein said diffusion-weighted magnetic resonance imaging technique comprises a diffusion-weighted gradient-echo pulse sequence.

9. The method of claim 1, wherein said diffusion-weighted magnetic resonance imaging technique comprises a diffusion-weighted stimulated echo pulse sequence.

10. A clinical method for evaluating the efficacy of a medical treatment, comprising the steps of:

a. providing a patient undergoing medical treatment having a region of diseased tissue; said region selected from the group comprising: the neck, the chest and cardiovascular system, the abdomen, pelvis and all internal organs, and the musculoskeletal system including the spine, the axial skeleton, the arms and the legs;

b. placing said region within a constant external magnetic field;

c. applying at least one diffusion-weighted spin-echo pulse sequence to said region; and d. differentiating necrotic from viable tissue based on magnetic resonance signals produced by said diffusion-weighted spin-echo pulse sequence, and diffusion coefficients of said region of diseased tissue calculated therefrom, so as to evaluate the efficacy of said medical treatment.

11. The method of claim 10, wherein said patient is a patient with a neoplastic disease and said diseased tissue is tumor tissue.

12. The method of claim 11, wherein said neoplastic disease is gastrointestinal cancer.

13. The method of claim 11, wherein said neoplastic disease is pancreatic cancer.

14. The method of claim 11, wherein said neoplastic disease is colon cancer.

15. The method of claim 11, wherein said neoplastic disease is melanoma.

16. The method of claim 11, wherein said neoplastic disease is lung cancer.

17. The method of claim 11, wherein said neoplastic disease is a musculoskeletal neoplasm.

18. The method of claim 10, wherein said patient is a patient with an inflammatory disease, and said diseased tissue is inflamed tissue.

19. The method of claim 10, wherein said patient is a patient with an infectious disease, and said diseased tissue is infected tissue.

20. A diagnostic method for differentiating necrotic from viable tissue in vivo, comprising the steps of:

a. providing a patient having a suspected region of necrotic tissue;

b. placing said suspected region within a constant external magnetic field;

c. applying at least one diffusion-weighted magnetic resonance imaging technique to said suspected region; and d. differentiating necrotic from viable tissue based on magnetic resonance signals produced by said imaging technique, wherein said magnetic resonance signals are used to calculate diffusion coefficients, and said diffusion coefficients are used to differentiate necrotic from viable tissue in said suspected region.

21. The method of claim 20, wherein said suspected region is selected from the group comprising: the neck, the chest and cardiovascular system, the abdomen, pelvis and all internal organs, and the musculoskeletal system including the spine, the axial skeleton, the arms and the legs.

22. The method of claim 20, wherein said diffusion-weighted magnetic resonance imaging technique comprises a diffusion-weighted spin-echo pulse sequence.

23. The method of claim 20, wherein said diffusion-weighted magnetic resonance imaging technique comprises a diffusion-weighted gradient-echo pulse sequence.

24. The method of claim 20, wherein said diffusion-weighted magnetic resonance imaging technique comprises a diffusion-weighted stimulated echo pulse sequence.

25. The method of claim 20, wherein said necrotic tissue comprises cancer tissue.

* * * * *